United States Patent [19]

Remington et al.

[11] Patent Number: 4,620,299

[45] Date of Patent: Oct. 28, 1986

[54] ROW DECODER

[75] Inventors: Scott Remington; William L. Martino, Jr., both of Austin, Tex.

[73] Assignee: Motorola, Inc., Schaumburg, Ill.

[21] Appl. No.: 709,262

[22] Filed: Mar. 4, 1985

[51] Int. Cl.⁴ .......................... G11C 8/00; G11C 7/02
[52] U.S. Cl. ..................................... 365/230; 365/189
[58] Field of Search ................ 365/189, 230, 203, 206

[56] References Cited

U.S. PATENT DOCUMENTS 4,259,731  3/1981  Moench .............................. 365/206

Primary Examiner—Joseph A. Popek

Attorney, Agent, or Firm—Anthony J. Sarli, Jr.; Jeffrey Van Myers; James L. Clingan, Jr.

[57] ABSTRACT

A logic decoder provides a true output signal at a first logic state when selected during an active cycle and during an inactive cycle, and at a second logic state when deselected. The logic decoder also provides a complementary output signal. A word line driver circuit couples decoded address signals to respective word lines when the output signal is in the first logic state. A coupling circuit couples one of first and second word lines to ground during the active cycle. A coupling transistor couples the first and second word lines together in response to receiving the complementary output signal at the first logic state.

12 Claims, 2 Drawing Figures

ROW DECODER

FIELD OF THE INVENTION

The invention relates to decoders, and more particularly, to decoders for use in memories in which unselected word lines are to be held at a predetermined reference voltage.

BACKGROUND OF THE INVENTION

In memories, individual memory cells are aligned along rows and columns. Each row has a word line to which cells along that row are attached. The cells along a row are enabled when the word line to which the cells are attached is enabled. It is important that only the word line for the selected row be enabled. Due to capacitive coupling of various clock signals with fast switching times, it is possible to enable a word line of an unselected row with capacitive coupling unless measures are taken to prevent this. This is typically achieved by clamping deselected word lines to ground which is very effective. Clamping the deselected word lines to ground requires circuitry additional to that required for a typical decoder. The clamping of deselected word lines to ground can also cause extra capacitive loading or speed problems. In U.S. Pat. No. 4,259,731, entitled "Quiet Row Selection Circuit", issued Mar. 31, 1981, assigned to the assignee hereof, an effective technique for clamping deselected word lines is disclosed. A disadvantage of the technique disclosed therein, however, is there is added capacitive loading on the gate of a word line driver transistor. This transistor is self-bootstrapped so the gate will rise above the power supply voltage. The added capacitance to the gate dilutes the bootstrap effect.

Typically, memory decoders are NOR decoders which have a relatively high input capacitance. This causes significant loading to the address buffers which provide the address signals to the decoders. The address signals are input to the gates of transistors which form the NOR decoder. The output of the NOR decoder is on the drains of these transistors. The output is thus inverted from the input. Consequently, the gate to drain capacitance is always charged between a logic high and a logic low. Consequently, a change in state of the NOR decoder not only requires that the gate to drain capacitance be charged but also discharged to the opposite polarity. This also adversely affects the speed of the decoder.

SUMMARY OF THE INVENTION

An object of the invention is to provide an improved row decoder.

Another object of the invention is to provide a quiet row decoder with reduced input capacitance.

Yet another object of the invention is to provide a row decoder with an improved quiet row technique.

These and other objects of the invention are achieved in a row decoder which has an active cycle and an inactive cycle and which enables at least one of a plurality of word lines when selected during the active cycle. The row decoder has a logic decoder circuit, a word line driver circuit, a coupling circuit, and a coupling transistor. The logic decoder circuit, responsive to a plurality of address signals, provides an output signal at a first logic state during the active cycle in response to the plurality of address signals selecting the logic decoder circuit, provides the output signal at a second logic state during the active cycle in response to the plurality of address signals deselecting the logic decoder circuit, provides the output signal at the first logic state during the inactive cycle, and provides a signal complementary to the output signal. The word line driver circuit couples a plurality of decoded address signals to respective word lines in response to the output signal being in the first logic state. The coupling circuit, which is coupled to first and second word lines of the plurality of word lines, couples one of the first and second word lines to a first reference terminal during the active cycle. The coupling transistor has a first current electrode coupled to the first word line, a second current electrode coupled to the second word line, and a control electrode for receiving the signal complementary to the output signal.

DESCRIPTION OF THE INVENTION

Figure 1:
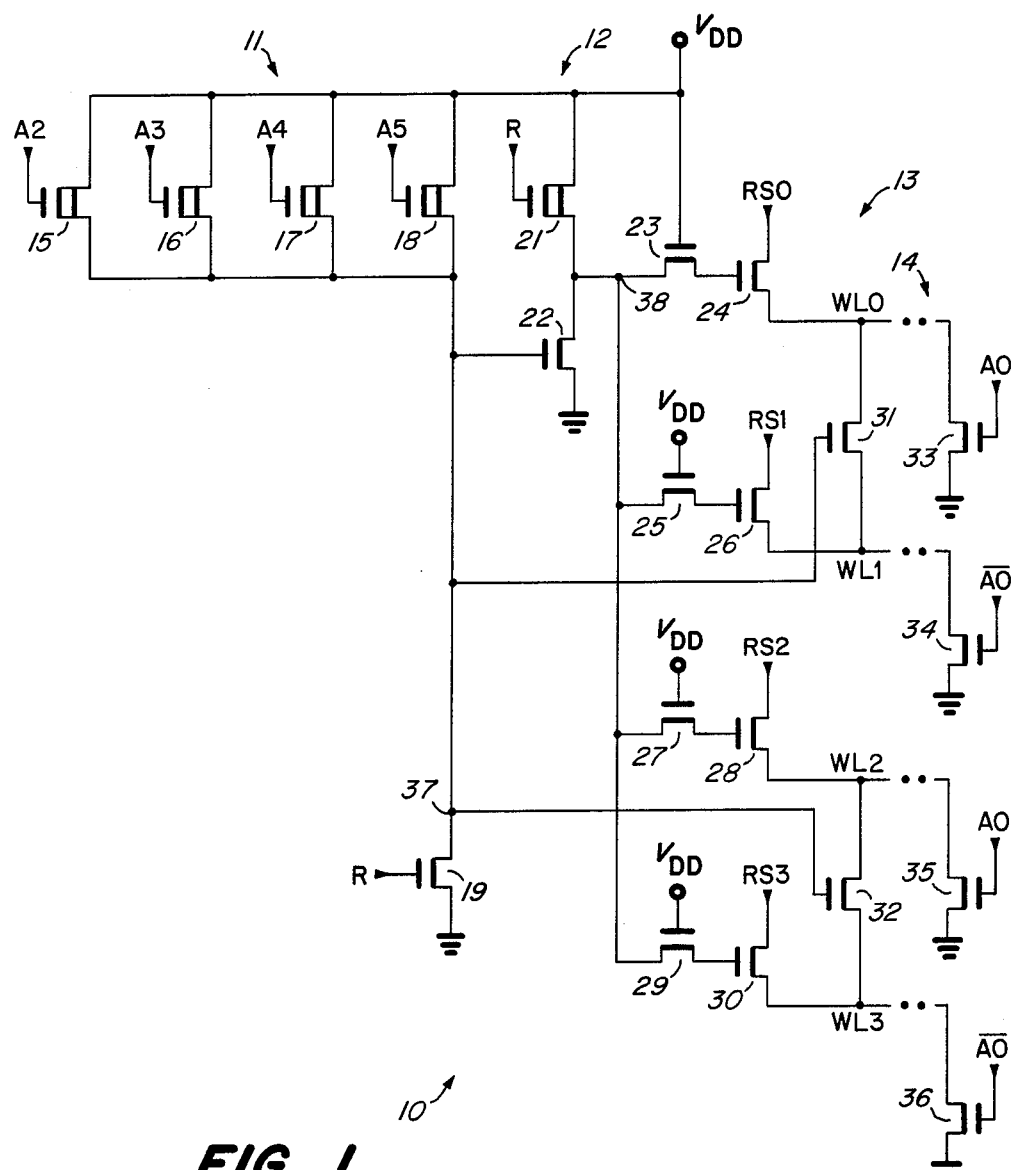
FIG. 1 is a circuit diagram of a decoder according to a preferred embodiment of the invention.

Shown in FIG. 1 is a row decoder 10 comprised generally of a main decoder 11, a clocked inverter 12, a word-line-driver decoder 13 and a word line clamping circuit 14. Main decoder 11 comprises transistors 15, 16, 17, 18 and 19. Inverter 12 comprises transistors 21 and 22. Word-line-driver decoder 13 comprises transistors 23, 24, 25, 26, 27, 28, 29, 30, 31 and 32. Clamping circuit 14 comprises transistors 33, 34, 35 and 36. The transistors used in row decoder 10 are N channel insulated gate field effect transistors that are either enhancement transistors or natural transistors. The natural transistors have a threshold voltage of −0.1 to 0.2 volt. The enhancement transistors have a threshold voltage of 0.5 to 0.8 volt. Transistors 15–18 and 21 are natural transistors. Transistors 22–32 and 19 are enhancement transistors.

Transistor 15 has gate for receiving an address signal A2, a drain connected to a positive power supply terminal VDD for receiving, for example, 5 volts, and a source connected to a node 37 for providing an output of decoder 11. Transistor 16 has a gate for receiving an address signal A3, a drain connected to VDD, and a source connected to node 37. Transistor 17 has a gate for receiving an address signal A4, a drain connected to VDD, and a source connected to node 37. Transistor 18 has a gate for receiving an address signal A5, a drain connected to VDD, and a source connected to node 37. Transistor 21 has a gate for receiving a row signal R, a drain connected to VDD, and a source connected to a node 38 for providing an output of inverter 12. Transistor 22 has a gate connected to node 37, a drain connected to node 38, and a source connected to ground. Transistors 23–32 utilize the bilateral nature of insulated gate field effect transistors. Transistor 23 has a control electrode connected to VDD, a first current electrode connected to node 38, and a second current electrode. Transistor 24 has a control electrode connected to the second current electrode of transistor 23, a first current electrode for receiving a decoded clock signal RS0, and a second current electrode connected to a word line WL0. Transistor 25 has a control electrode connected to VDD, a first current electrode connected to node 38, and a second current electrode. Transistor 26 has a control electrode connected to the second current electrode of transistor 25, a first current electrode for receiving a decoded clock signal RS1, and a second current electrode connected to a word line WL1. Transistor 27 has a control electrode connected to VDD, a first current electrode connected to node 38, and a second current electrode. Transistor 28 has a control electrode connected to the second current electrode of transistor 27, a first current electrode for receiving a decoded clock signal RS2, and a second current electrode connected to a word line WL2. Transistor 29 has a control electrode connected to VDD, a first current electrode connected to node 38, and a second current electrode. Transistor 30 has a control electrode connected to the second current electrode of transistor 29, a first current electrode for receiving a decoded clock signal RS3, and a second current electrode connected to a word line WL3. Transistor 31 has a control electrode connected to node 37, a first current electrode connected to word line WL0, and a second current electrode connected to word line WL1. Transistor 32 has a control electrode connected to node 37, a first current electrode connected to word line WL2, and a second current electrode connected to a word line WL3. Transistor 33 has a gate for receiving an address signal A0, a drain connected to word line WLO, and a source connected to ground. Transistor 34 has a gate for receiving a complement of address signal A0, a drain connected to word line WL1, and a source connected to ground. Transistor 35 has a gate for receiving signal A0, a drain connected to word line WL2, and a source connected to ground. Transistor 36 has a gate for receiving the complement of signal A0, a drain connected to word line WL3, and a source connected to ground.

Decoder 10 is primarily intended for use in a memory. In a memory, many memory cells are connected to word lines WL0-WL3 between transistors 33-36, which are connected at one end of word lines WL0-WL3, and transistors 24, 26, 28, 30, 31, and 32, which are connected at the other end of word lines WL0-WL3. When one of word lines WL0-WL3 receives a logic high, it is considered enabled because the cells connected thereto are enabled. Alternate word lines WL0-WL3 in the memory are clamped to ground during the selection of a word line by transistors 33-36. For decoder 10, word lines WL0 and will be clamped to ground, or word lines WL1 and WL3 will be clamped to ground. In a memory there will be many other word lines alternately clampled to ground.

In operaton, decoder 10 cycles between an active cycle and an inactive cycle. The active cycle begins when signal R switches from a logic high at or near the voltage at VDD to a logic low at or near ground potential. The active cycle ends when signal R switches back to a logic high. A word line of the memory is selected during the active cycle. The word line selected during the active cycle may be one of word lines WL0-WL3 or another word line not shown. During the inactive cycle, address signals A2-A5 are all held at a logic low so that transistors 15-18 are not conducting. With transistors 19 and 21 receiving signal R at a logic high, transistors 19 and 21 are conducting. With transistor 19 conducting, node 37 is at a logic low, causing transistor 22 to be non-conducting. With transistor 21 conducting and transistor 22 not conducting, node 38 is at a logic high. Inverter 12, in effect, causes node 37 and node 38 to be complementary to each other. Inverter 12 can either be viewed as part of a logic decoder which provides complementary signals or as part of a circuit for driving word lines WL0-WL3. Because transistor 21 of inverter 12 is a natural transistor, the logic high on node 38 is very near the voltage at VDD. The logic high on node 38 is coupled to transistors 24, 26, 28 and 30 via transistors 23, 25, 27 and 29, respectively. Consequently, transistors 24, 26, 28 and 30 are conducting. During the inactive cycle, signals RS0-RS3 are a logic low. Consequently, word lines WL0-WL3 are held at a logic low by signals RS0-RS3 via transistors 24, 26, 28 and 30 during the inactive cycle, the desired result.

The active cycle begins by signal R switching to a logic low causing transistors 19 and 21 to be non-conducting. Node 37 is capacitively held at a logic low unless changed by address signals A2-A5 via transistors 15-18, respectively. For the case in which decoder 10 is deselected during the active cycle, one or more of address signals A2-A5 will be a logic high during the active cycle. Prior to the active cycle, address signals A2-A5 are held at a logic low. A small delay time after signal R switches to a logic low, address signals A2-A5 become active. If one or more of address signals A2-A5 switch to a logic high when they become active, node 37 will be a logic high. With node 37 at a logic high, transistor 22 becomes conductive, causing node 38 to switch to a logic low. Because the gates of transistors 23, 25, 27 and 29 are connected to VDD, the logic low at node 38 is coupled to the gates of transistors 24, 26, 28 and 30, causing transistors 24, 26, 28 and 30 to be non-conductive. A short delay time after address signals A2-A5 become active, one of decoded clock signals RS0-RS3 switches to a logic high. Assume, for example, that signal RS3 switches to a logic high. Because transistor 30 is non-conductive, signal RS3 at a logic high is not coupled to word line WL3. Because transistors 24, 26, 28 and 30 are non-conductive, transistors 24, 26, 28 and 30 are not used to clamp word lines WL0-WL3 to ground. Transistors 31, 32 and 33-36 are used to clamp word lines WL0-WL3 to ground. For the example in which signal RS3 switches to a logic high, signal A0 is a logic high. Consequently, transistors 33 and 35 are conducting, coupling word lines WL0 and WL2 to ground. Because node 37 has switched to a logic high, transistors 31 and 32 are conducting. Consequently, the logic low at word line WL0 causes word line WL1 also to be a logic low. Likewise, the logic low at word line WL2 causes word line WL3 to be a logic low. When decoder 10 is deselected, word lines WL0-WL3 are thus clamped to ground. The alternate clamping of word lines WL0-WL3 to ground is only critical during the active cycle because transistors 24, 26, 28 and 30 clamp word lines WL0-WL3 to ground during the inactive cycle. Consequently, the alternate clamping of word lines WL0-WL3 during the inactive cycle is optional.

When decoder 10 is selected, all of address signals A2-A5 remain at a logic low when address signals A2-A5 become active. After signal R switches to a logic low and address signals A2-A5 become active, node 37 remains capacitively held at a logic low because signals A2-A5 remain at a logic low. With node 37 remaining at a logic low, transistor 22 remains non-conductive. Although transistor 21 is non-conductive because signal R is now a logic low, node 38 remains capacitively held at a logic high. Consequently, the gates of transistors 24, 26, 28 and 30 remain at a logic high so that transistors 24, 26, 28 and 30 remain conductive. Assuming again that signal RS3 is the decoded clock signal among RS0-RS3 that switches to a logic high, word line WL3 switches to a logic high in response to signal RS3 switching to a logic high. Transistor 29 provides some isolation between the gate of transistor 30 and node 38 so that the gate of transistor 30 rises in voltage in response to signal RS3 switching to a logic high. This is known as self-bootstrapping. Word lines WL0-WL2 are held to ground by signals RS0-RS2 being a logic low and transistors 24, 26 and 28 conducting. Transistors 33-36 respond to signal A0 and the complement thereof as in the case when decoder 10 is deselected. Transistors 33-36 are not actually needed, however, in the case in which decoder 10 is selected. Transistors 31 and 32 are not conducting because node 37 is a logic low which prevents transistor 32 from providing adverse coupling between the logic high on word line WL3 and the logic low on word line WL2. Decoder 10 thus keeps all but the selected word line, word line WL3 in the foregoing example, tied to ground, the desired result.

Decoded signals RS0-RS3 represent a decode of address signals A0 and A1. If address signals A0 and A1 are a logic low, signal RS0 will be clocked to a logic high during the active cycle. If signal A0 is a logic high and signal A1 is a logic low, signal RS1 will be clocked to a logic high. If signal A0 is a logic low and signal A1 is a logic high, signal RS2 will be clocked to a logic high. If signal A0 is a logic high and signal A1 is a logic high, signal RS3 will be clocked to a logic high. Transistors 33 and 35 are conducting when signal A0 is a logic high, but will not be conducting when either signal RS0 or RS2 are clocked to a logic high because signals RS0 and RS2 are only clocked to a logic high when signal A0 is a logic low. Conversely, transistors 34 and 36 will not be conducting when either signal RS1 or RS3 is clocked to a logic high because signals RS1 and RS3 are clocked to a logic high only when signal A0 is a logic high which is when the complement of signal A0 is a logic low.

Main decoder 11 is an OR decoder instead of the conventional NOR decoder. In a memory there are many decoders each with a main decoder which receives a unique set of true and complementary address signals. As in a NOR decoder, OR decoder 11 is selected when all of the input signals, address signals A2-A5 are a logic low. Consequently, in all but one OR decoder, the common source connection, node 37 in OR decoder 11, will switch from a logic low to a logic high. With the word-line-driver circuit 13 configuration, the deselection response time determines the response time of decoder 10. When OR decoder 11 is selected, nodes 37 and 38 remain the same logic state to which they were precharged during the inactive cycle so that transistors 24, 26, 28 and 30 simply remain conductive. When deselected, however, transistors 24, 26, 28 and 30 must become non-conductive before the clocking occurs for signals RS0-RS3. OR decoder 11 responds very quickly because the output is provided by the sources of transistors 15-18. Capacitance from gate to source actually speeds the response on the source to a change on the gate because the source changes in the same direction as the gate. When, for example, signal A2 switches from a logic low to a logic high to drive node 37 from a logic low to a logic high, capacitance from the gate to the source of transistor 15 actually tends to increase the responsiveness of node 37 to the change on the gate of transistor 15. In a NOR decoder, the output is on the drain so that the input and output switch in opposite directions. Consequently, the response of the NOR decoder is slowed by gate to drain capacitance. Additionally, a NOR decoder has more effective input capacitance also because the output switches in the opposite direction from the input. The drain is precharged to a logic high while the input is a logic low so the gate to drain capacitance is charged to minus 4-5 volts. After the input has switched from a logic low to a logic high and the output has switched from a logic high to a logic low, the gate to drain capacitance is charged to a plus 4-5 volts. Consequently, not only must the gate to drain capacitance be discharged but must be charged in the opposite direction. There is also gate to source capacitance which must be charged. The gate to source capacitance of a transistor in a NOR decoder and the gate to drain capacitance of a transistor in an OR decoder each contribute about the same to the effective input capacitance of the particular decoder. The difference is that the gate to source capacitance of a transistor in an OR decoder contributes very little to the input capacitance of the OR decoder, whereas the gate to drain capacitance of a transistor in a NOR decoder contributes substantially to the input capacitance of the NOR decoder.

Although inverter 12 does add some propagation delay in the deselection process for decoder 10, OR decoder 11 responds more quickly than a conventional NOR decoder so that there is compensation for the speed loss caused by inverter 12. OR decoder 11 provides much reduced loading on address buffers (not shown) which provide address signals A2-A5. Each address signal is routed to half of the decoders in the memory so the loading effect on the address buffers is significant. OR decoder 11 also provides a convenient logic high during deselection for enabling transistors 31 and 32.

Figure 2:
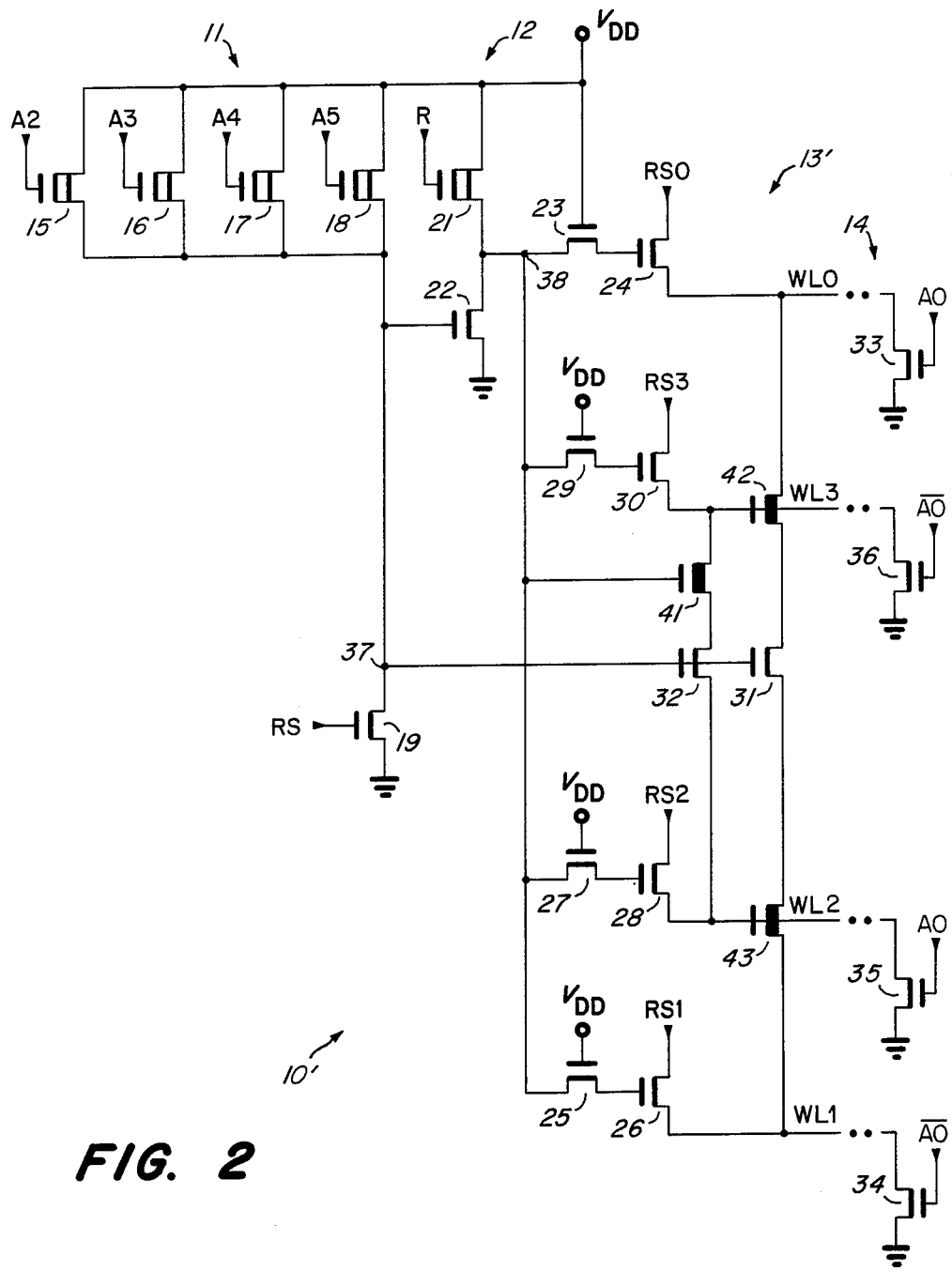
FIG. 2 is a circuit diagram of the decoder of FIG. 1 modified for layout considerations.

Shown in FIG. 2 is a row decoder 10' which is the same as row decoder 10 of FIG. 1 except that transistor 19 is clocked by a reset row enable signal RS instead of signal R and that word-line-driver decoder 13' of FIG. 2 has three additional transistors 41, 42 and 43. Transistors 41-43 are N channel insulated gate field effect transistors that are depletion transistors having a threshold voltage of about −12 volts. Transistor 41 is interposed between the second current electrode of transistor 32 and word line WL3. Transistor 42 is interposed between the first current electrode of transistor 31 and word line WL0. Transistor 43 is interposed between the second current electrode of transistor 31 and word line WL1. Transistor 41 has a control electrode connected to node 38, a first current electrode connected to word line WL3, and a second current electrode connected to the second current electrode of transistor 32. Transistor 42 has a control electrode connected to word line WL3, a first current electrode connected to word line WL0, and a second current electrode connected to the first current electrode of transistor 31. Transistor 43 has a control electrode connected to word line WL2, a first current electrode connected to the second current electrode of transistor 31, and a second current electrode connected to word line WL1. Transistors 41-43 perform no function in the operation of decoder 10' other than as conductors. Transistors 41-43 are always conductive. The reason transistors 41-43 are present at all is for efficiency in laying out decoder 10'. Signals RS0-RS3 are provided by metal to many other decoders. Word lines WL0-WL3 are in polysilicon. A portion of node 38 is also in polysilicon. A portion of node 37 is in N+diffusion. In effect then there are physical locations in which it is desirable to have a signal carried by metal, a signal carried by polysilicon, and a signal carried by diffusion. The problem in this regard is that in a conventional process the polysilicon masks the diffusion, thus making a break in the diffusion. To complete the signal path under the polysilicon which masked the diffusion, an implant is made in the same way as a depletion transistor is typically made. Consequently, a signal path is completed under the polysilicon without regard to the logic state of the signal carried by the polysilicon.

Because 5 volts and ground are the only power supply connections required, it is a simple matter to ensure that the signal carried by such polysilicon will not be sufficiently negative to break the underlying signal path provided by a depletion transistor.

Signals RS and R switch to a logic low at essentially the same time to begin the active cycle. Signal RS, however, switches back to a logic high at the termination of the active cycle a small time before signal R switches to a logic high. A node analogous to node 37 will be a logic high on all but one decoder like decoder 10' during the active cycle. Node 37 at a logic high causes transistor 22 to be conductive. Consequently, node 37 must be a logic low before signal R switches to a logic high or both transistors 21 and 22 will be conductive at the same time, causing a current spike. With signal RS switching to a logic high prior to signal R switching to a logic high, node 37 switches to a logic low, and thus causes transistor 22 to be non-conductive before transistor 21 begins conducting. This power saving timing differential does not affect the functional aspect of the complementary nature of signals at nodes 37 and 38.

What is claimed:

1. A row decoder, having an active cycle and an inactive cycle, for enabling at least one of a plurality of word lines when selected, comprising:
   an OR decoder having an input for receiving a plurality of address signals, and an output for providing an output signal at a first logic state when the OR decoder is selected by the address signals and at a second logic state when the OR decoder is deselected by the address signals;
   word line driver means, coupled to the output of the OR decoder and to the plurality of word lines, for receiving a plurality of decoded address signals and for coupling said decoded address signals to respective word lines when the OR decoder is selected;
   first coupling means, coupled to first and second word lines of the plurality of word lines, for coupling one of the first and second word lines to a first reference terminal during the active cycle; and
   a first coupling transistor having a first current electrode coupled to the first word line, a second current electrode coupled to the second word line, and a control electrode coupled to the output of the OR decoder.

2. The row decoder of claim 1, wherein the word line driver means comprises:
   an inverter having an input coupled to the output of the OR decoder, and an output;
   a first driver transistor having a first current electrode for receiving a first decoded signal of the plurality of decoded signals, a second current electrode coupled to the first word line, and a control electrode coupled to the output of the inverter;
   a second driver transistor having a first current electrode coupled to a second decoded signal of the plurality of decoded signals, a second current electrode coupled to the second word line, and a control electrode coupled to the output of the inverter.

3. The row decoder of claim 2, wherein the word line driver means further comprises:
   a first isolation transistor, interposed between the output of the inverter and the control electrode of the first driver transistor, having a first current electrode coupled to the output of the inverter, a second current electrode coupled to the control electrode of the first driver transistor, and a control electrode coupled to a second power supply terminal; and
   a second isolation transistor, interposed between the output of the inverter and the control electrode of the second driver transistor, having a first current electrode coupled to the output of the inverter, a second current electrode coupled to the control electrode of the second driver transistor, and a control electrode coupled to the second power supply terminal.

4. The row decoder of claim 3, wherein the OR decoder comprises:
   a plurality of decoder transistors, each having a control electrode for receiving a respective one of the plurality of address signals, a first current electrode coupled to the second power supply terminal, and a second current electrode to form the output of the OR decoder; and
   a precharge transistor having a control electrode for receiving a precharge signal, a first current electrode coupled to the second current electrodes of the decoder transistors, and a second current electrode coupled to the first power supply terminal.

5. The row decoder of claim 4 further comprising:
   second coupling means, coupled to third and fourth word lines of the plurality of word lines, for coupling one of the third and fourth word lines to the first reference terminal during the active cycle; and
   a second coupling transistor having a first current electrode coupled to the third word line, a second current electrode coupled to the fourth word line, and a control electrode coupled to the output of the OR decoder.

6. The row decoder of claim 5, wherein the decoder transistors are natural transistors having a first threshold voltage, and the isolation transistors are enhancement transistors having a second threshold voltage, the first threshold voltage being less than the second threshold voltage.

7. A row decoder, having an active cycle and an inactive cycle, for enabling at least one of a plurality of word lines when selected during the active cycle, comprising:
   logic decoder means, responsive to a plurality of address signals during the active cycle, for providing an output signal at a first logic state during the active cycle in response to the plurality of address signals selecting the logic decoder means, for providing the output signal at a second logic state during the active cycle in response to the plurality of address signals deselecting the logic decoder means, for providing the output signal at the first logic state during the inactive cycle, and for providing a signal complementary to the output signal;

word line driver means, coupled to the logic decoder means to receive the output signal, for coupling a plurality of decoded address signals to respective word lines of the plurality of word lines in response to the output signal being in the first logic state;

first coupling means, coupled to first and second word lines of the plurality of word lines, for coupling a selected one of the first and second word lines to a first reference terminal during the active cycle; and a first coupling transistor having a first current electrode coupled to the first word line, a second current electrode coupled to the second word line, and a control electrode for receiving the signal complementary to the output signal.

8. The row decoder of claim 7, wherein the logic decoder means comprises:

a plurality of decoder transistors, each having a control electrode for receiving a respective one of the plurality of address signals, a first current electrode coupled to the second power supply terminal, and a second current electrode;

a precharge transistor having a control electrode for receiving a precharge signal, a first current electrode coupled to the second current electrodes of the decoder transistors and providing the signal complementary to the output signal, and a second current electrode coupled to the first reference terminal; and an inverter having an input coupled to the first current electrode of the precharge transistor, and an output for providing the output signal of the logic decoder means.

9. The row decoder of claim 8, wherein the word line driver comprises:

a first driver transistor having a first current electrode for receiving a first decoded signal of the plurality of decoded signals, a second current electrode coupled to the first word line, and a control electrode;

a second driver transistor having a first current electrode coupled to a second decoded signal of the plurality of decoded signals, a second current electrode coupled to the second word line, and a control electrode;

a first isolation transistor having a first current electrode coupled to the output of the inverter, a second current electrode coupled to the control electrode of the first driver transistor, and a control electrode coupled to a second reference terminal; and a second isolation transistor having a first current electrode coupled to the output of the inverter, a second current electrode coupled to the control electrode of the second driver transistor, and a control electrode coupled to the second power supply terminal.

10. The row decoder of claim 9 further comprising:

second coupling means, coupled to third and fourth word lines of the plurality of word lines, for coupling one of the third and fourth word lines to the first reference terminal during the active cycle; and a second coupling transistor having a first current electrode coupled to the third word line, a second current electrode coupled to the fourth word line, and a control electrode for receiving the signal complementary to the output signal.

11. The row decoder of claim 10, wherein the decoder transistors are natural transistors having a first threshold voltage, and the isolation transistors are enhancement transistors having a second threshold voltage, the first threshold voltage being less than the second threshold voltage.

12. In a row decoder, having an active cycle and an inactive cycle, for enabling at least one of a plurality of word lines when said row decoder is selected during the active cycle, a method comprising the steps of:

providing an output signal at a first logic state during the active cycle in response to the row decoder being selected;

providing the output signal at a second logic state during the active cycle in response to the row decoder being deselected;

providing the output signal at the first logic state during the inactive cycle;

providing a signal complementary to the output signal;

coupling decoded address signals to respective word lines in response to the output signal being in the first logic state;

coupling a first word line of the plurality of word lines to a first reference terminal in response to a first address signal being in a first logic state;

coupling a second word line of the plurality of word lines to the first reference terminal when the first address signal is in a second logic state; and coupling the first word line to the second word line in response to the signal complementary to the output signal being in the first logic state.

* * * * *